United States Patent
Filoteo, Jr. et al.

(10) Patent No.: US 8,138,080 B2
(45) Date of Patent: Mar. 20, 2012

(54) INTEGRATED CIRCUIT PACKAGE SYSTEM HAVING INTERCONNECT STACK AND EXTERNAL INTERCONNECT

(75) Inventors: Dario S. Filoteo, Jr., Singapore (SG); Leo A. Merilo, Singapore (SG); Philip Lyndon Cablao, Singapore (SG); Emmanuel Espiritu, Singapore (SG); Rachel Layda Abinan, Singapore (SG); Allan Ilagan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 592 days.

(21) Appl. No.: 11/276,716

(22) Filed: Mar. 10, 2006

(65) Prior Publication Data

US 2007/0210436 A1      Sep. 13, 2007

(51) Int. Cl.
*H01L 21/44*      (2006.01)

(52) U.S. Cl. ............... 438/617; 257/784; 257/E23.033

(58) Field of Classification Search .......... 257/784, 257/786; 438/617
See application file for complete search history.

(56) References Cited

U.S. PATENT DOCUMENTS

| | | | |
|---|---|---|---|
| 6,863,208 B2 | 3/2005 | Lee | |
| 2003/0127717 A1 * | 7/2003 | Fang | 257/678 |
| 2003/0230796 A1 * | 12/2003 | Ismail et al. | 257/686 |
| 2004/0152292 A1 | 8/2004 | Babinetz et al. | |
| 2004/0191954 A1 | 9/2004 | Ano | |
| 2005/0150933 A1 | 7/2005 | Chiu | |
| 2005/0205995 A1 * | 9/2005 | Ishikawa et al. | 257/738 |
| 2006/0186554 A1 * | 8/2006 | Otremba | 257/784 |

FOREIGN PATENT DOCUMENTS

DE      10 2005 006 333      *      2/2005

* cited by examiner

*Primary Examiner* — Ajay K Arora
(74) *Attorney, Agent, or Firm* — Mikio Ishimaru

(57) ABSTRACT

An integrated circuit package system is provided forming an integrated circuit die having a first bond pad provided thereon, forming an interconnect stack on a first external interconnect, and connecting the interconnect stack to the first bond pad.

20 Claims, 2 Drawing Sheets

INTEGRATED CIRCUIT PACKAGE SYSTEM HAVING INTERCONNECT STACK AND EXTERNAL INTERCONNECT

TECHNICAL FIELD

The present invention relates generally to integrated circuit packages and more particularly to integrated circuit package with wire bonding.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large scale integration have underscored the need for back mixed-signal solutions. Numerous technologies have been developed to meet these requirements. Some of the research and development strategies focus on new technologies while others focus on improving the mature package technologies.

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. The extreme miniaturization and integration of functions into a single integrated circuit device must still be tested for functionality and for debug purposes.

In response to the demands for reduced package dimensions and increased functional integration the test and debug functions requires additional visibility of the integrated circuit beyond the normal operation input, output (I/O). This often leads to the integrated circuit die having more I/O than the package pins. Some approaches attempt to handle the I/O differences through internal circuit designs leading to more complex I/O designs and increasing risk. Others approaches tie multiple bond wires to a single pin but requires more surface area on the pins.

Thus, a need still remains for the integrated circuit package system providing low cost manufacturing as well as reduced package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming an integrated circuit die having a first bond pad provided thereon, forming an interconnect stack on a first external interconnect, and connecting the interconnect stack to the first bond pad.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
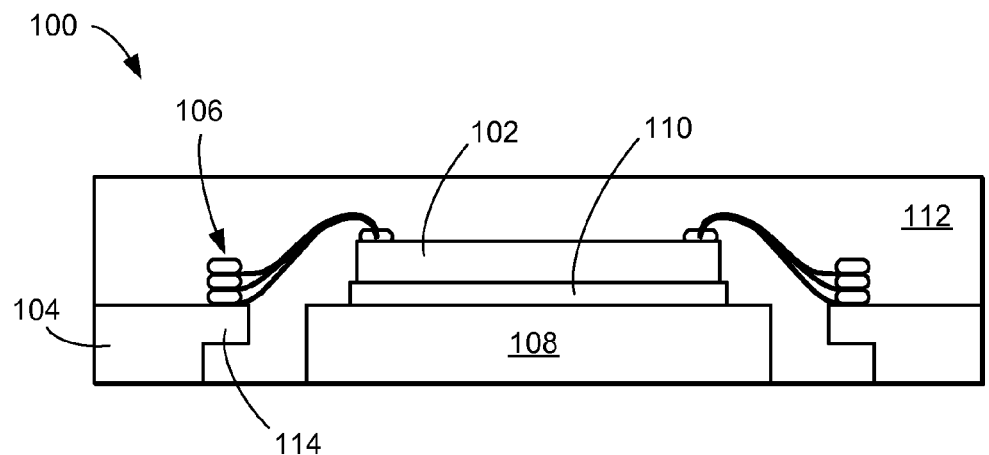
FIG. 1 is a cross-sectional view of a portion of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a portion of an integrated circuit package system 100 in an embodiment of the present invention. The integrated circuit package system 100 includes an integrated circuit die 102 connects to leads 104, such as lead fingers or external interconnects, with an interconnect stack 106. The integrated circuit die 102 attaches on a die paddle 108 with an adhesive 110. An encapsulation 112, such as an epoxy mold compound (EMC), covers the integrated circuit die 102, the leads 104, the interconnect stack 106, and the die paddle 108. The integrated circuit die 102 may be supported by other structures making the die paddle 108 optional.

The leads 104 have portions, such as bottoms and outer sides, exposed from the encapsulation 112. The leads 104 have lead tips 114 that are elevated from the bottoms of the leads 104. The interconnect stack 106 attaches on the lead tips 114. The horizontal dimensions of the interconnect stack 106 allow the horizontal dimensions of the leads 104 and the lead tips 114 to be minimal.

For illustrative purpose, the integrated circuit die 102 is shown as above the lead tips 114, although it is understood that the integrated circuit die 102 may be in different vertical relationship to the leads 104 and the lead tips 114. Also for illustrative purpose, the leads 104 are shown as a single row, although it is understood that the leads 104 may be more than a single row.

Figure 2:
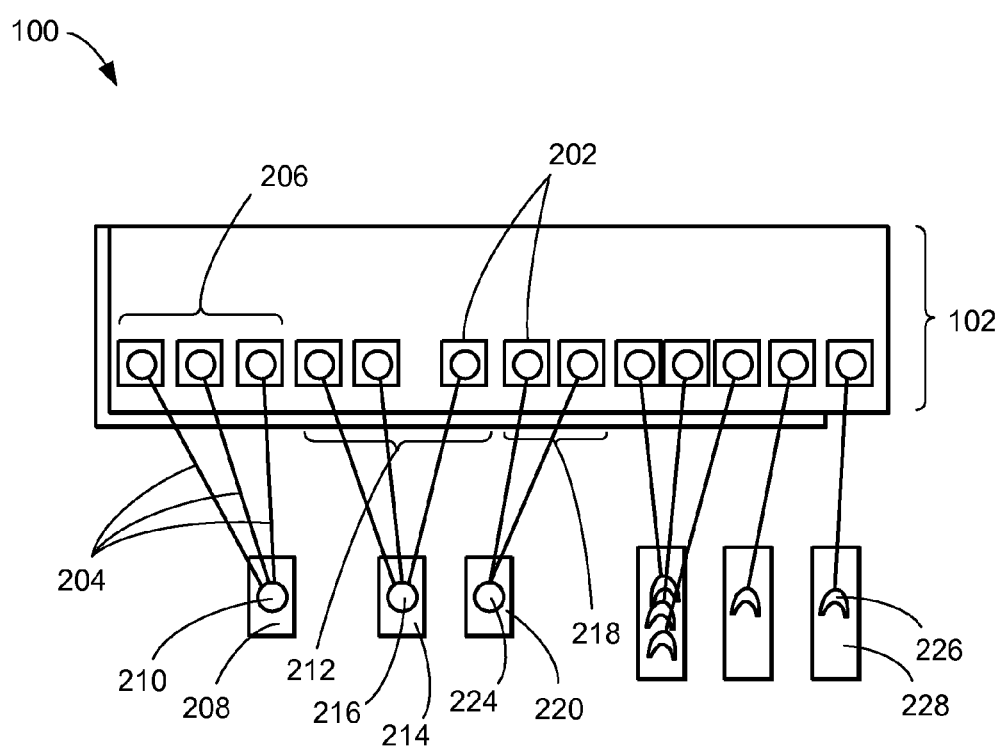
FIG. 2 is a top view of the portion of the integrated circuit package system.

Referring now to FIG. 2, therein is shown a top view of the portion of the integrated circuit package system 100. The top view depicts bond pads 202 at the edge of the integrated circuit die 102. Interconnects 204, such as wire stitches, connect a first group 206 of the bond pads 202 to first lead 208 forming a first interconnect stack 210. The interconnects 204 also connect a second group 212 of the bond pads 202 to a second lead 214 forming a second interconnect stack 216. The interconnects 204 further connect a third group 218 of the bond pads 202 to a third lead 220. The first lead 208, the second lead 214, and the third lead 220 partially make up the leads 104 of FIG. 1. The first interconnect stack 210, the second interconnect stack 216, and a third interconnect stack 224 may be represented as the interconnect stack 106 of FIG. 1. A single interconnect 226 may also connect one of the bond pads 202 to a fourth lead 228.

For illustrative purpose, the first lead 208, the second lead 214, and the third lead 220 are shown as part of a single row of the leads 104 of FIG. 1, although it is understood that the first lead 208, the second lead 214, and the third lead 220 may be in different rows. Also for illustrative purpose, the bond pads 202 are shown in a single row, although it is understood that the bond pads 202 may not be in a single row, such as in a staggered or an array configuration. Further for illustrative purpose, the interconnects 204 of the first interconnect stack 210, the second interconnect stack 216, and the third interconnect stack 224 is shown connected to a number of the bond pads 202, although it is understood that the interconnects 204 of the first interconnect stack 210, the second interconnect stack 216, and the third interconnect stack 224 may connect to one of the bond pads 202. Yet further for illustrative purpose, the interconnects 204 of each of the first interconnect stack 210, the second interconnect stack 216, and the third interconnect stack 224 is shown connected to the bond pads 202 adjacent to one another, although it is understood that the interconnects 204 may connect to the bond pads 202 not adjacent to one another.

The first interconnect stack 210, the second interconnect stack 216, and the third interconnect stack 224 may be used to distribute power or grounds from a single pin of the package. Drive or sink capabilities may be enhanced by ganging the circuits (not shown) of the bond pads 202 of the first interconnect stack 210, the second interconnect stack 216, and the third interconnect stack 224. Different types of interface and protocols may be supported by a single pin of the package with each of the interconnect stack. The interconnect stack may be used to provide mode control bond outs for production parts versus debug or test parts.

Figure 3:
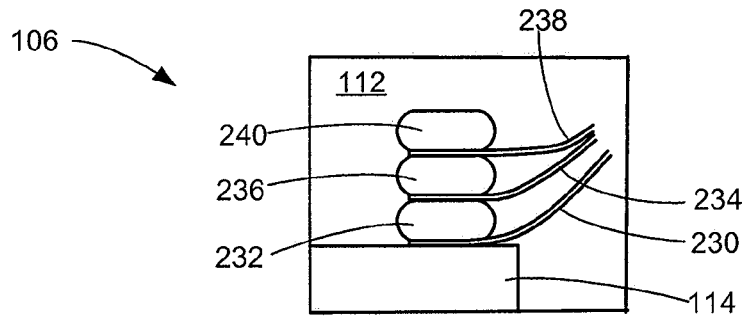
FIG. 3 is a more detailed cross-sectional view of the interconnect stack on one of the lead tips.

Referring now to FIG. 3, therein is shown a more detailed cross-sectional view of the interconnect stack 106 on one of the lead tips 114. The interconnect stack 106 includes a first wire stitch 230, such as a conductive material, attached to one of the lead tips 114. A first ball bond 232 is on the first wire stitch 230. A second wire stitch 234 attaches to the first ball bond 232. A second ball bond 236 is on the second wire stitch 234. A third wire stitch 238 attaches to the second ball bond 236. A third ball bond 240 is on the third wire stitch 238 forming the interconnect stack 106. The interconnection stack 106 has an equal number of wire stitches and ball bonds with a ball bond such as the third ball bond 240 at a topmost of the interconnection stack 106. The encapsulation 112 covers the lead tips 114 and the first wire stitch 230, the first ball bond 232, the second wire stitch 234, the second ball bond 236, the third wire stitch 238, and the third ball bond 240.

The interconnect stack 106 has the first ball bond 232, the second ball bond 236, and the third ball bond 240 with substantially the same height and diameter. A portion of the first wire stitch 230, the second wire stitch 234, and the third wire stitch 238 under the respective ball bond is substantially the same as the length as the diameter of the ball bond above providing maximum electrical contact.

The first wire stitch 230 may be attached to one of the lead tips 114 by a number of processes, such as thermosonic or ultrasonic bonding. Ultrasonic bonding uses a combination of vibration and force to rub the interface between the first wire stitch 230 and one of the lead tips 114, causing a localized temperature rise that promotes the diffusion of molecules across the boundary. Thermosonic bonding, in addition to vibration, uses heat, which further encourages the migration of materials.

The first ball bond 232 may be attached to the first wire stitch 230 by a number of processes, such as a capillary (not shown) holding a wire (not shown). A ball, such as the first ball bond 232, the second ball bond 236, or the third ball bond 240, forms on one end of the wire and presses against the face of the capillary. The ball may be formed with a hydrogen flame or a high voltage electrical spark. The capillary pushes the ball against one of the lead tips 114, and then, while holding the ball one of the lead tips 114, ultrasonic vibration is applied, which bonds the ball to one of the lead tips 114.

For illustrative purpose, the first ball bond 232, the second ball bond 236, and the third ball bond 240 are shown with substantially the same height and diameter, although it is understood that the heights and diameters may differ. Also for illustrative purpose, wire stitches are shown as part of the interconnect stack 106, although it is understood that the interconnect stack 106 may be formed with other interconnect structures, such as planar interconnects.

Figure 4:
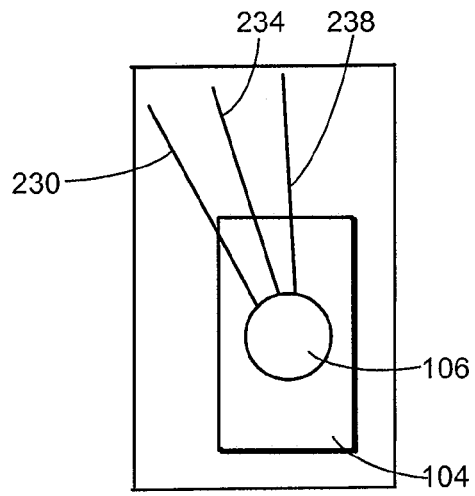
FIG. 4 is a more detailed top view of the interconnect stack on one of the leads.

Referring now to FIG. 4, therein is shown a more detailed top view of the interconnect stack 106 on one of the leads 104. The top view depicts the first wire stitch 230, the second wire stitch 234, and the third wire stitch 238 forming the interconnect stack 106 on one of the leads 104. A diameter of the interconnect stack 106 requires minimum space compared to connecting multiple wires onto one of the leads 104 without wire stacking. This minimizes the dimensions while increasing the pin density of the integrated circuit package system 100.

Figure 5:
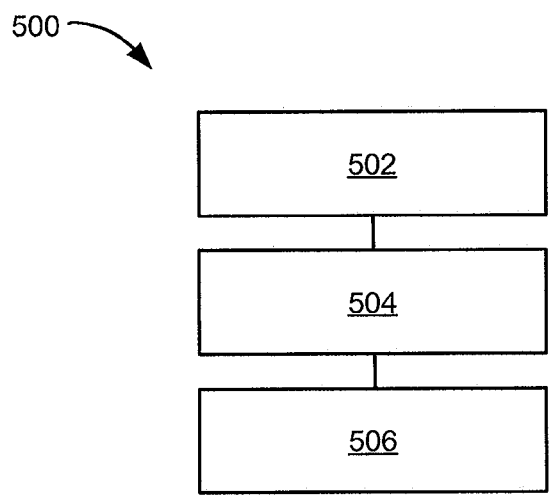
FIG. 5 is a flow chart of an integrated circuit package system for manufacture of the integrated circuit package system in an embodiment of the present invention.

Referring now to FIG. 5, therein is shown a flow chart of an integrated circuit package system 500 for the manufacture of the integrated circuit package system 100 in an embodiment of the present invention. The system 500 includes forming an integrated circuit die having a first bond pad provided thereon in a block 502; forming an interconnect stack on a first external interconnect in a block 504; and connecting the interconnect stack to the first bond pad in a block 506.

In greater detail, a method to manufacture the integrated circuit package system 100, in an embodiment of the present invention, is performed as follows:
1. Forming an integrated circuit die having a first bond pad provided thereon. (FIG. 1)
2. Forming a interconnect stack on a first lead. (FIG. 1)
3. Connecting the interconnect stack on a first bond pad. (FIG. 1)
4. Encapsulating the integrated circuit die, the interconnect stack, and the first lead. (FIG. 1)

It has been discovered that the present invention thus has numerous aspects.

It has been discovered that the present invention provides interconnect stacking for flexible pinout capabilities to support development and manufacture tests while minimizing package dimensions and increasing pin densities for production products. The interconnect stacking also offers functional benefits.

An aspect is that the present invention connects multiple bond pads of an integrated circuit die which may be connected to a single pin for a production package. The individual bond pads may represent test, debug, or mode select pads used for manufacture and debug tests but "hidden" from the production pin out. This flexibility simplifies the manufacturing process and reduces test times while minimizing the package footprint.

Another aspect of the present invention is that the interconnect stack requires less space than interconnects without stacking. The resulting package may increase pin density and/or reduce package footprint.

Yet another aspect of the present invention is to provide functional flexibility by tying multiple bond pads to a single pin. The integrated circuit die may be programmable such that each or a subset of the bond pad may be tied to different types of input/output (I/O) supporting different direct current (DC) levels and/or alternating current (AC) characteristics as well as different protocols. The I/O circuits from the bond pads may be "ganged" as needed.

Yet another aspect of the present invention is to increase conductivity for power and/or ground distribution to the integrated circuit die. The multiple wires increase the electrical conductivity when connected to multiple bond pads or to a single bond pad. The spread of the wires from one pin to multiple bond pads distributes the power and grounds without requiring addition pins.

Yet another aspect of the present invention is to reduce the package height provided by the flexible pinout options with the interconnect stack on the leads instead of the integrated circuit die.

Thus, it has been discovered that the integrated circuit package system method of the present invention furnishes important and heretofore unknown and unavailable solutions, capabilities, and functional aspects for increasing chip density in systems while simplifying manufacturing, test, and production processes. The resulting processes and configurations are straightforward, cost-effective, uncomplicated, highly versatile and effective, can be implemented by adapting known technologies, and are thus readily suited for efficiently and economically manufacturing stacked integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacturing an integrated circuit package system comprising:

forming an integrated circuit die having a first bond pad provided thereon;

forming an interconnect stack having a wire stitch directly on a first external interconnect and a ball bond directly on the wire stitch, the interconnect stack having an equal number of wire stitches and ball bonds with one of the ball bonds as a topmost part of the interconnect stack;

connecting the interconnect stack to the first bond pad; and forming an encapsulation covering the integrated circuit die, the interconnect stack, and the first external interconnect with the first external interconnect exposed from the encapsulation.

2. The method as claimed in claim 1 wherein forming the interconnect stack comprises:

attaching a first interconnect on the first external interconnect;

forming a first ball bond on the first interconnect;

attaching a second interconnect on the first ball bond; and forming a second ball bond on the second interconnect.

3. The method as claimed in claim 1 further comprising connecting the interconnect stack to a group of first bond pads of the integrated circuit die.

4. The method as claimed in claim 1 further comprising connecting an interconnect between a second external interconnect and a second bond pad of the integrated circuit die.

5. The method as claimed in claim 1 further comprising attaching the integrated circuit die on a die paddle adjacent to the first external interconnect.

6. A method of manufacturing an integrated circuit package system comprising:

forming an integrated circuit die having a first bond pad provided thereon;

forming a interconnect stack having a wire stitch directly on a first lead and a ball bond directly on the wire stitch, the interconnect stack having an equal number of wire stitches and ball bonds with one of the ball bonds as a topmost part of the interconnect stack;

connecting the interconnect stack on a first bond pad; and forming an encapsulation covering the integrated circuit die, the interconnect stack, and the first lead with the first lead exposed from the encapsulation.

7. The method as claimed in claim 6 wherein forming the interconnect stack comprises:

attaching a first wire stitch on the first lead;

forming a first ball bond on the first wire stitch;

attaching a second wire stitch on the first ball bond; and forming a second ball bond on the second wire stitch.

8. The method as claimed in claim 6 further comprising connecting an interconnect between a second lead and a second bond pad of the integrated circuit die.

9. The method as claimed in claim 6 further comprising forming first bond pads of the integrated circuit die is in a configuration of an array.

10. The method as claimed in claim 6 further comprising forming first bond pads of the integrated circuit die is at a boundary of the integrated circuit die.

11. An integrated circuit package system comprising:

an integrated circuit die having a first bond pad provided thereon;

an interconnect stack having a wire stitch directly on a first external interconnect and a ball bond directly on the wire stitch, the interconnect stack connected to the first bond pad, the interconnect stack having an equal number of wire stitches and ball bonds with one of the ball bonds as a topmost part of the interconnect stack; and an encapsulation covering the integrated circuit die, the interconnect stack, and the first external interconnect with the first external interconnect exposed from the encapsulation.

12. The system as claimed in claim 11 wherein the interconnect stack comprises:
a first interconnect on the first external interconnect;
a first ball bond on the first interconnect;
a second interconnect on the first ball bond; and
a second ball bond on the second interconnect.

13. The system as claimed in claim 11 further comprising the interconnect stack connected to a group of first bond pads of the integrated circuit die.

14. The system as claimed in claim 11 further comprising an interconnect between a second external interconnect and a second bond pad of the integrated circuit die.

15. The system as claimed in claim 11 further comprising the integrated circuit die on a die paddle adjacent to the first external interconnect.

16. The system as claimed in claim 11 wherein:
the integrated circuit die having the first bond pad provided thereon has an active side;
the interconnect stack on the first external interconnect, the interconnect stack connected to the first bond pad has a wire; and
the first external interconnect is a first lead.

17. The system as claimed in claim 16 wherein the interconnect stack comprises:
a first wire stitch on the first lead;
a first ball bond on the first wire stitch;
a second wire stitch on the first ball bond; and
a second ball bond on the second wire stitch.

18. The system as claimed in claim 16 further comprising an interconnect between a second lead and a second bond pad of the integrated circuit die.

19. The system as claimed in claim 16 further comprising first bond pads of the integrated circuit die is in a configuration of an array.

20. The system as claimed in claim 16 further comprising first bond pads of the integrated circuit die is at a boundary of the integrated circuit die.

\* \* \* \* \*